United States Patent
Xie et al.

(10) Patent No.: US 10,283,617 B1
(45) Date of Patent: May 7, 2019

(54) HYBRID SPACER INTEGRATION FOR FIELD-EFFECT TRANSISTORS

(71) Applicant: GLOBALFOUNDRIES Inc., Grand Cayman (KY)

(72) Inventors: Ruilong Xie, Niskayuna, NY (US); Dong-Ick Lee, Loudonville, NY (US); Min Gyu Sung, Latham, NY (US); Chanro Park, Clifton Park, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/800,563

(22) Filed: Nov. 1, 2017

(51) Int. Cl.
| | |
|---|---|
| *H01L 29/66* | (2006.01) |
| *H01L 21/768* | (2006.01) |
| *H01L 21/02* | (2006.01) |
| *H01L 29/78* | (2006.01) |
| *H01L 21/321* | (2006.01) |
| *H01L 29/417* | (2006.01) |
| *H01L 21/311* | (2006.01) |
| *H01L 21/3065* | (2006.01) |
| *H01L 29/08* | (2006.01) |
| *H01L 21/3105* | (2006.01) |

(52) U.S. Cl.
CPC .... *H01L 29/66545* (2013.01); *H01L 21/0217* (2013.01); *H01L 21/02178* (2013.01); *H01L 21/02181* (2013.01); *H01L 21/76802* (2013.01); *H01L 21/76877* (2013.01); *H01L 29/6656* (2013.01); *H01L 29/66795* (2013.01); *H01L 29/7851* (2013.01); *H01L 21/0228* (2013.01); *H01L 21/3065* (2013.01); *H01L 21/31053* (2013.01); *H01L 21/31116* (2013.01); *H01L 21/3212* (2013.01); *H01L 29/0847* (2013.01); *H01L 29/41791* (2013.01)

(58) Field of Classification Search
CPC ......... H01L 29/66545; H01L 29/66795; H01L 21/76802; H01L 21/76877; H01L 29/6656
See application file for complete search history.

(56) References Cited

U.S. PATENT DOCUMENTS

| | | | | |
|---|---|---|---|---|
| 7,170,111 | B2 | 1/2007 | Saxler | |
| 8,728,908 | B2* | 5/2014 | Xie | H01L 21/28088 438/431 |
| 9,105,578 | B2* | 8/2015 | Liang | H01L 21/28008 |
| 9,130,023 | B2* | 9/2015 | Yamasaki | H01L 21/823842 |
| 9,312,182 | B2* | 4/2016 | Xie | H01L 21/823437 |
| 9,601,497 | B1* | 3/2017 | Chen | H01L 27/1104 |
| 9,735,256 | B2* | 8/2017 | Chang | H01L 29/6681 |
| 9,761,483 | B1* | 9/2017 | Chang | H01L 29/66545 |

(Continued)

*Primary Examiner* — William Coleman
(74) *Attorney, Agent, or Firm* — Thompson Hine LLP; Anthony Canale

(57) ABSTRACT

Device structures and fabrication methods for a field-effect transistor. A first dielectric spacer adjacent to a sidewall of a gate placeholder structure. A contact placeholder structure is formed adjacent to the first dielectric spacer such that the first dielectric spacer is arranged laterally between the gate placeholder structure and the contact placeholder structure. The contact placeholder structure and the first dielectric spacer are recessed to open a space over the contact placeholder structure and the first dielectric spacer. A second dielectric spacer is formed in the space adjacent to the sidewall of the gate placeholder structure and over the first dielectric spacer.

20 Claims, 12 Drawing Sheets

(56) References Cited

U.S. PATENT DOCUMENTS

| | | | |
|---|---|---|---|
| 9,799,651 B2* | 10/2017 | Chang | H01L 21/76802 |
| 9,859,389 B1* | 1/2018 | Cheng | H01L 29/41791 |
| 9,899,321 B1* | 2/2018 | Park | H01L 23/528 |
| 2009/0137093 A1* | 5/2009 | Lin | H01L 27/10876 |
| | | | 438/421 |
| 2016/0268203 A1* | 9/2016 | Lu | H01L 21/31144 |
| 2017/0317079 A1* | 11/2017 | Kim | H01L 21/30604 |
| 2018/0019339 A1* | 1/2018 | Colinge | H01L 29/7851 |
| 2018/0033863 A1* | 2/2018 | Xie | H01L 29/4991 |
| 2018/0033866 A1* | 2/2018 | Liao | H01L 21/28123 |

* cited by examiner

HYBRID SPACER INTEGRATION FOR FIELD-EFFECT TRANSISTORS

BACKGROUND

The invention relates generally to semiconductor device and integrated circuit fabrication and, in particular, to device structures and fabrication methods for a field-effect transistor.

Device structures for a field-effect transistor generally include a source region, a drain region, and a gate electrode configured to switch carrier flow in a channel formed in a body region. When a control voltage exceeding a designated threshold voltage is applied to the gate electrode, carrier flow occurs in the channel between the source and drain regions to produce a device output current. The body region of a planar field-effect transistor is located beneath the top surface of a substrate on which the gate electrode is supported.

A fin-type field-effect transistor (FinFET) is a non-planar device structure that may be more densely packed in an integrated circuit than planar field-effect transistors. A FinFET may include a fin consisting of a three-dimensional body of semiconductor material, heavily-doped source and drain regions formed in sections of the fin, and a gate electrode that wraps about the fin between the source and drain regions. The arrangement between the gate structure and fin body improves control over the channel and reduces the leakage current when the FinFET is in its 'Off' state in comparison with planar field-effect transistors. This, in turn, enables the use of lower threshold voltages than in planar field-effect transistors, and results in improved performance and lowered power consumption.

SUMMARY

In an embodiment of the invention, a method includes forming a first dielectric spacer adjacent to a sidewall of a gate placeholder structure, and forming a contact placeholder structure adjacent to the first dielectric spacer such that the first dielectric spacer is arranged laterally between the gate placeholder structure and the contact placeholder structure. The method further includes recessing the contact placeholder structure and the first dielectric spacer to open a space over the contact placeholder structure and the first dielectric spacer. A second dielectric spacer is formed in the space adjacent to the sidewall of the gate placeholder structure and over the first dielectric spacer.

In an embodiment of the invention, a structure includes a semiconductor fin with a top surface and a source/drain region, a gate structure extending across the top surface of the semiconductor fin, a first contact extending vertically to contact the source/drain region, and a second contact extending vertically to contact the gate structure. The structure further includes a first dielectric spacer on the top surface of the semiconductor fin adjacent to the gate structure. The dielectric spacer is arranged laterally between the first contact and the gate structure. The dielectric spacer has a top surface, the first contact has a top surface, and the top surface of the first contact is closer to the top surface of the semiconductor fin than the top surface of the dielectric spacer.

In an embodiment of the invention, a method includes forming a gate placeholder structure that includes a sacrificial gate structure and a dielectric cap on the sacrificial gate structure, and forming a first dielectric spacer and a second dielectric spacer respectively adjacent to opposite sidewalls of the gate placeholder structure. After forming the first dielectric spacer and the second dielectric spacer, the dielectric cap is removed from the sacrificial gate structure to open a space vertically above the sacrificial gate structure and laterally between the first dielectric spacer and the second dielectric spacer. After removing the dielectric cap, a layer composed of a sacrificial material is deposited in the space to increase a height of the sacrificial gate structure.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 12B is a diagrammatic top view showing the locations of the gate structures, the fins, the TS contacts, a contact opening to one of the TS contacts, and a contact opening to one of the gate structures, and in which FIG. 12 is taken generally along line 12-12 and FIG. 12A is taken generally along line 12A-12A.

DETAILED DESCRIPTION

Figure 1:
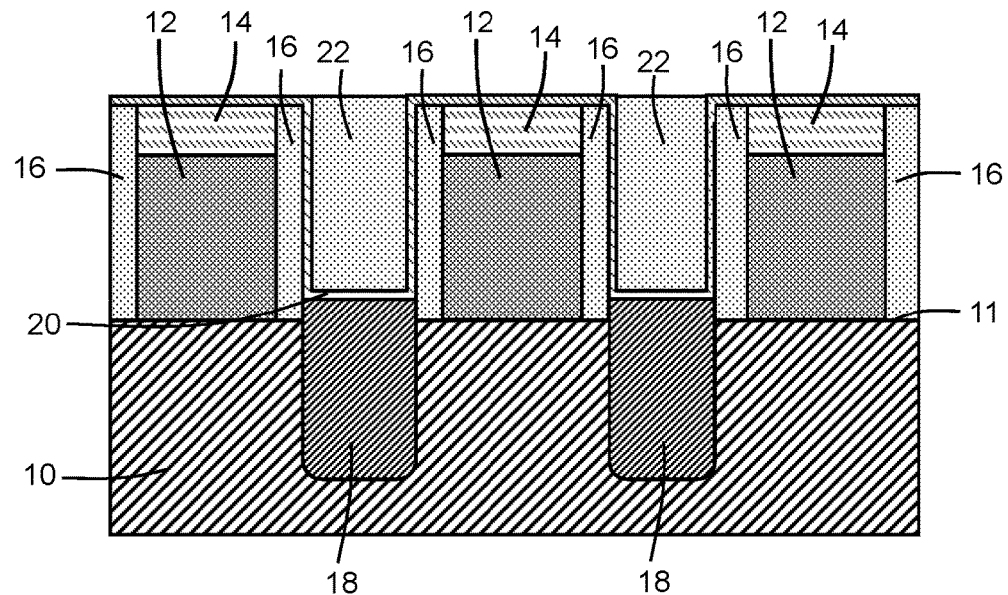
FIGS. 1-11 are cross-sectional views of a device structure at successive fabrication stages of a processing method in accordance with embodiments of the invention.

With reference to FIG. 1 and in accordance with embodiments of the invention, a device structure includes a fin 10 and sacrificial gate structures 12 are arranged on a top surface of the fin 10. The fin 10 is a shaped semiconductor layer that projects in a vertical direction relative to a substrate (not shown), such as a bulk single-crystal substrate composed of silicon or a III-V material, or a silicon device layer of a silicon-on-insulator (SOI) substrate. The fin 10 may be formed by patterning the substrate or an epitaxial layer grown on the substrate using a sidewall imaging transfer (SIT) process, self-aligned double patterning (SADP), or self-aligned quadruple patterning (SAQP). While not shown, the device structure may include multiple fins 10 that are aligned parallel to each other. In an alternative, embodiment, the device structure may be formed with a planar construction in which the fin 10 or fins 10 are replaced by a different type of semiconductor layer, such as a device layer of an SOI substrate or a bulk substrate.

The sacrificial gate structures 12 are elements of placeholder structures for functional gate structures that are formed in a subsequent processing stage. The sacrificial gate structures 12 may be formed by depositing a thin dielectric layer, such as silicon dioxide (SiO2) by atomic layer deposition (ALD), and then a blanket layer of a sacrificial material, such as amorphous silicon or polysilicon by chemical vapor deposition (CVD), and patterning these layers using sections of a hardmask as an etch mask and an anisotropic etching process. The placeholder structures may include caps 14 representing the hardmask sections that reside on the sacrificial gate structures 12 after patterning. The sacrificial gate structures 12 may wrap about a channel region of each fin 10.

Dielectric spacers 16 are formed adjacent to the sidewalls of each sacrificial gate structure 12 and its associated cap 14. The dielectric spacers 16 extend vertically from a top surface 11 of the fin 10 to the top surface of the caps 14. The dielectric spacers 16 may be composed of a dielectric material, such as a low-k dielectric material having a dielectric constant (i.e., permittivity) less than the dielectric constant of silicon nitride ($Si_3N_4$). Low-k dielectric materials suitable for the dielectric spacers 16 include, but are not limited to, silicon oxycarbonitride (SiOCN) or carbon-incorporated silicon oxide (SiOC), deposited as a conformal layer by atomic layer deposition (ALD) and etched with a directional etching process such as reactive ion etching (RIE).

Source/drain regions 18 are arranged adjacent to the sacrificial gate structures 12 and at least in part within cavities in the fin 10 defined by a self-aligned etching process, such as a reactive ion etching (RIE) process. As used herein, the term "source/drain region" means a doped region of semiconductor material that can function as either a source or a drain of a field-effect transistor. The source/drain regions 18 may be formed by an epitaxial growth process. For an n-type field-effect transistor, the source/drain regions 18 may be composed of epitaxially-grown semiconductor material doped with an n-type dopant from Group V of the Periodic Table (e.g., phosphorus (P) or arsenic (As)) to provide n-type conductivity. For a p-type field-effect transistor, the source/drain regions 18 may be composed of epitaxially-grown semiconductor material doped with a p-type dopant selected from Group III of the Periodic Table (e.g., boron (B)) to provide p-type conductivity.

The dielectric spacers 16 on the sacrificial gate structures 12, caps 14, and source/drain regions 18 are clad by vertical sections of a contact etch stop layer (CESL) 20. The CESL 20 may be constituted by a thin layer composed of silicon nitride ($Si_3N_4$) deposited by atomic layer deposition (ALD). The CESL 20 participates in protecting the dielectric spacers 16 during subsequent etch processes.

An interlayer dielectric layer 22 is formed having sections that cover the source/drain regions 18 and fill the gaps adjacent to and between the sacrificial gate structure 12. The interlayer dielectric layer 22 may be composed of a dielectric material, such as silicon dioxide (SiO2) deposited by a flowable chemical vapor deposition (FCVD) process and planarized by chemical mechanical polishing (CMP) to be coplanar with the top surface of the caps 14 and/or the CESL 20. The sections of the interlayer dielectric layer 22 represent sacrificial structures in the form of temporary placeholders that are removed and replaced in subsequent fabrication stages of the processing method that form contacts extending vertically to the source/drain regions 18.

Figure 2:
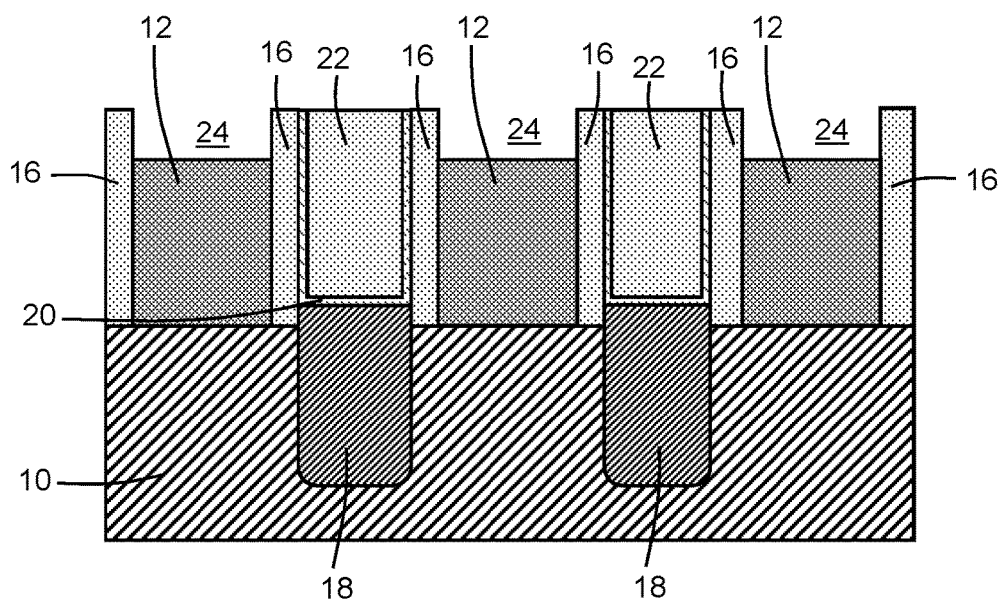

With reference to FIG. 2 in which like reference numerals refer to like features in FIG. 1 and at a subsequent fabrication stage, the caps 14 are removed selective to the interlayer dielectric layer 22 and the dielectric spacers 16, as well as the sacrificial gate structures 12. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The caps 14 may be removed with an etching process, such as reactive ion etching (RIE), using an etch chemistry selected to provide the etch selectivity. The removal of the caps 14 opens cavities 24 above the sacrificial gate structures 12 and between the dielectric spacers 16.

Figure 3:
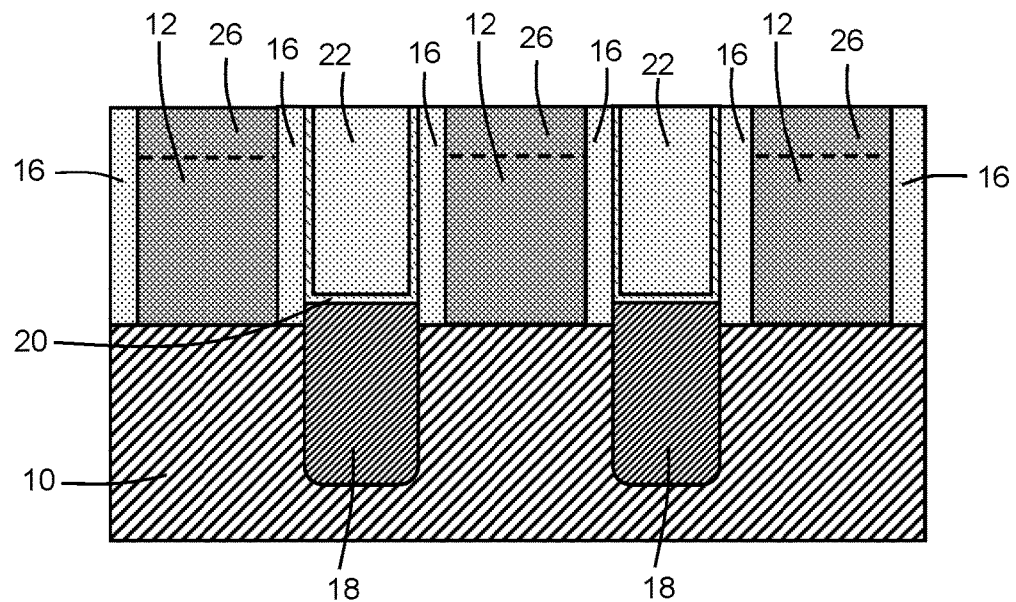

With reference to FIG. 3 in which like reference numerals refer to like features in FIG. 2 and at a subsequent fabrication stage, the cavities 24 (FIG. 2) are filled with plugs 26 comprised of a sacrificial material. The plugs 26 may be composed of, for example, the same sacrificial material as used to initially form the sacrificial gate structures 12. For example, the sacrificial material may be amorphous silicon or polysilicon that is deposited by chemical vapor deposition (CVD) and planarized with chemical mechanical polish (CMP). The addition of the plugs 26 increases the height of the sacrificial gate structures 12, which are exposed at the top surface of the structure. The increase in the aspect ratio of the sacrificial gate structures 12 may provide better a process window for subsequent events in which the gate height might be reduced.

Figure 4:
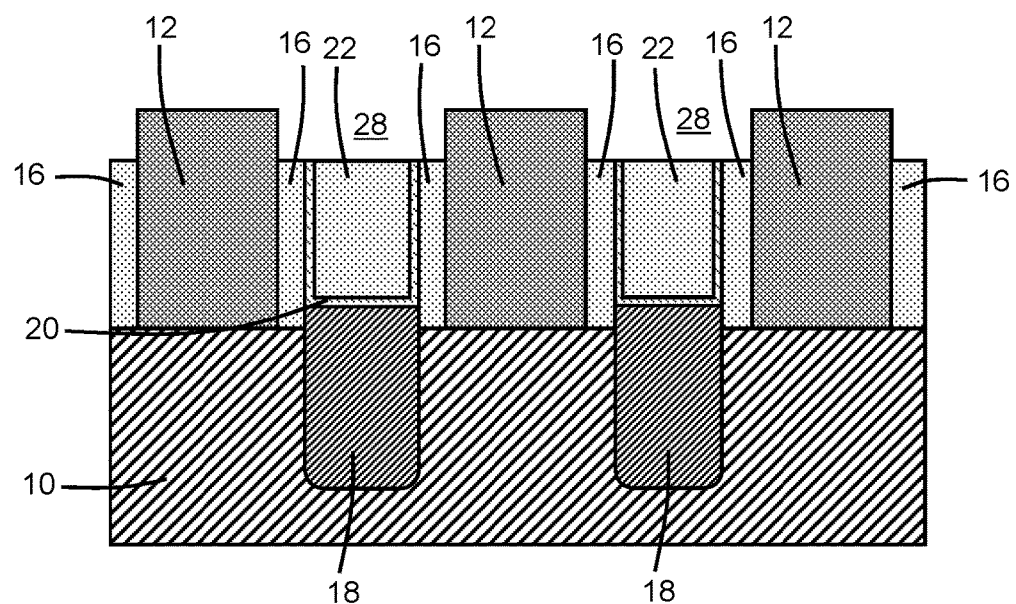

With reference to FIG. 4 in which like reference numerals refer to like features in FIG. 3 and at a subsequent fabrication stage, the interlayer dielectric layer 22 may be recessed relative to the sacrificial gate structures 12 by an etching process with an etch chemistry that is selective to the materials of the sacrificial gate structures 12, the dielectric spacers 16, and the CESL 20. Sections of the CESL 20 arranged above the top surface of the recessed interlayer dielectric layer 22 are then removed to expose sections of the dielectric spacers 16. The sections of the CESL 20 are removed by an etching process with an etch chemistry that is selective to the materials of the sacrificial gate structures 12, the dielectric spacers 16, and the interlayer dielectric layer 22. Sections of the dielectric spacers 16 arranged above the top surface of the recessed interlayer dielectric layer 22 are then removed to expose sections of the sacrificial gate structures 12. The sections of the dielectric spacers 16 are removed by an etching process with an etch chemistry that is selective to the materials of the sacrificial gate structures 12, the CESL 20, and the interlayer dielectric layer 22. In an alternative embodiment, the interlayer dielectric layer 22 may be recessed and the sections of the dielectric spacers 16 and CESL 20 may be all removed by an etching process with an etch chemistry that is selective to the material of the sacrificial gate structures 12. Cavities 28 are opened above the interlayer dielectric layer 22 and between the sacrificial gate structures 12, which project above the dielectric spacers 16 and interlayer dielectric layer 22.

Figure 5:
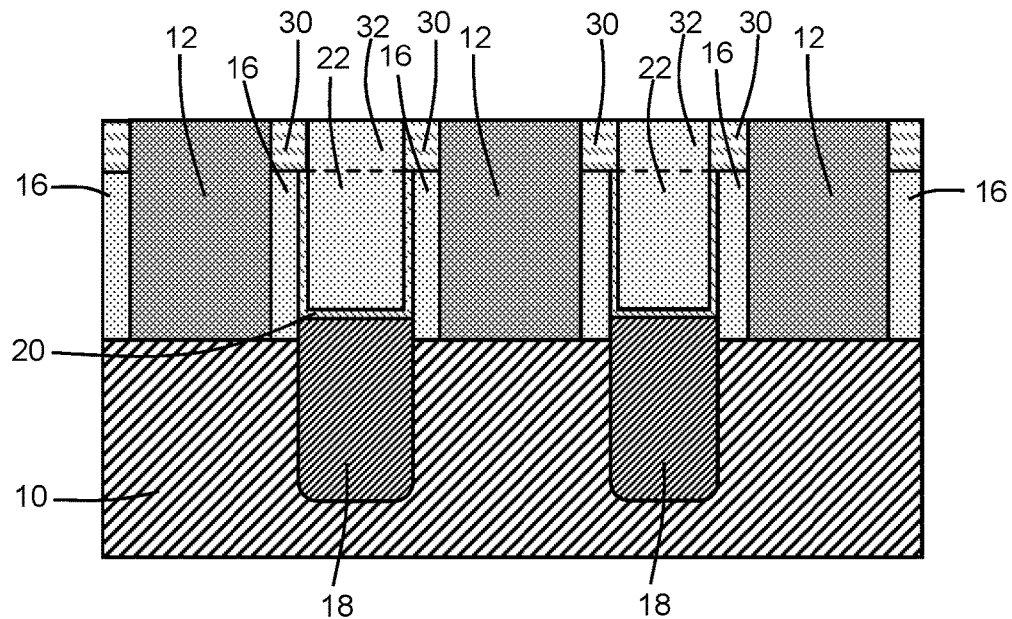

With reference to FIG. 5 in which like reference numerals refer to like features in FIG. 4 and at a subsequent fabrication stage, dielectric spacers 30 are formed in a portion of the open space of the cavities 28 and completely cover the respective top surfaces of the dielectric spacers 16. In the latter regard, the dielectric spacers 30 have a width that is greater than the width of the dielectric spacers 16. The dielectric spacers 30 may be composed of a dielectric material, such as silicon nitride ($Si_3N_4$), that is more robust under etching (i.e., more etch resistant) than the low-k dielectric material of the dielectric spacers 16. The dielectric spacers 30 may be formed by depositing a conformal layer by atomic layer deposition (ALD) and etching the conformal layer with a directional etching process such as reactive ion etching (RIE). The CESL 20 and dielectric spacers 30 cooperate to isolate the dielectric spacers 16 from the space containing the interlayer dielectric layer 22 over the majority of the height of the dielectric spacers 16.

The dielectric spacers 16 and the dielectric spacers 30, in combination, provide hybrid spacers in which the dielectric spacers 16 and the dielectric spacers 30 are composed of respective dielectric materials with different etch selectivities. The dielectric spacers 30 have a lower etch rate when exposed to an etch chemistry that selectively removes silicon dioxide relative to silicon nitride than the dielectric spacers 16. Such an etch chemistry is used, for example, when removing the sections of the interlayer dielectric layer 22 overlying the source/drain regions 18.

Plugs 32 are formed inside the portions of the cavities 28 that are not filled by the dielectric spacers 30. The plugs 32 may be composed of a dielectric material, such as an oxide of silicon (e.g., silicon dioxide ($SiO_2$)) that is deposited by high-density plasma chemical vapor deposition (HDP-CVD) and planarized to be coplanar with the top surface of the sacrificial gate structures 12. The plugs 32, which may be composed of the same dielectric material as the interlayer dielectric layer 22, restore the thickness of the interlayer dielectric layer 22.

Figure 6:
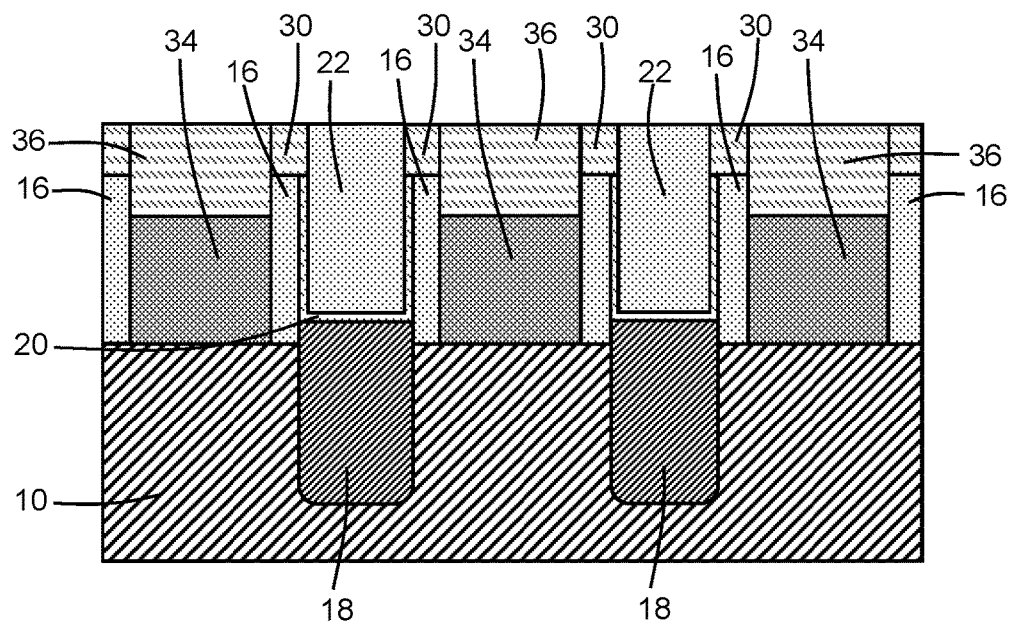

With reference to FIG. 6 in which like reference numerals refer to like features in FIG. 5 and at a subsequent fabrication stage, the sacrificial gate structures 12 are pulled and removed using an etching process that is selective to the materials of the dielectric spacers 30 and the interlayer dielectric layer 22. Functional gate structures 34 of a field-effect transistor may be formed in the spaces from which the sacrificial gate structures 12 are pulled. Each of the functional gate structures 34 overlaps with a channel region in the fin 10. The functional gate structures 34 may include a gate electrode and a gate dielectric interposed between the gate electrode and the semiconductor material of the fin 10. The gate electrode may include one or more barrier metal layers, work function metal layers, and/or fill metal layers that are composed of conductors, such as metals (e.g., tungsten (W)) and/or metal nitrides or carbides (e.g., titanium nitride (TiN) and titanium aluminum carbide (TiAlC)). The gate dielectric may be composed of a dielectric material, such as a high-k dielectric material like hafnium oxide ($HfO_2$).

The functional gate structures 34 may be recessed with an etching process such that a top surface of each functional gate structure 34 is arranged below a top surface of the dielectric spacers 16. The portions of the spaces from which the sacrificial gate structures 12 are pulled that are above the recessed functional gate structures 34 are filled with caps 36. The caps 36 may be composed of silicon nitride ($Si_3N_4$) deposited by chemical vapor deposition (CVD) and planarized with a thin layer composed of silicon nitride ($Si_3N_4$) deposited by atomic layer deposition (ALD) and planarized by chemical mechanical polishing (CMP) to be coplanar with the top surface of the interlayer dielectric layer 22.

Figure 7:
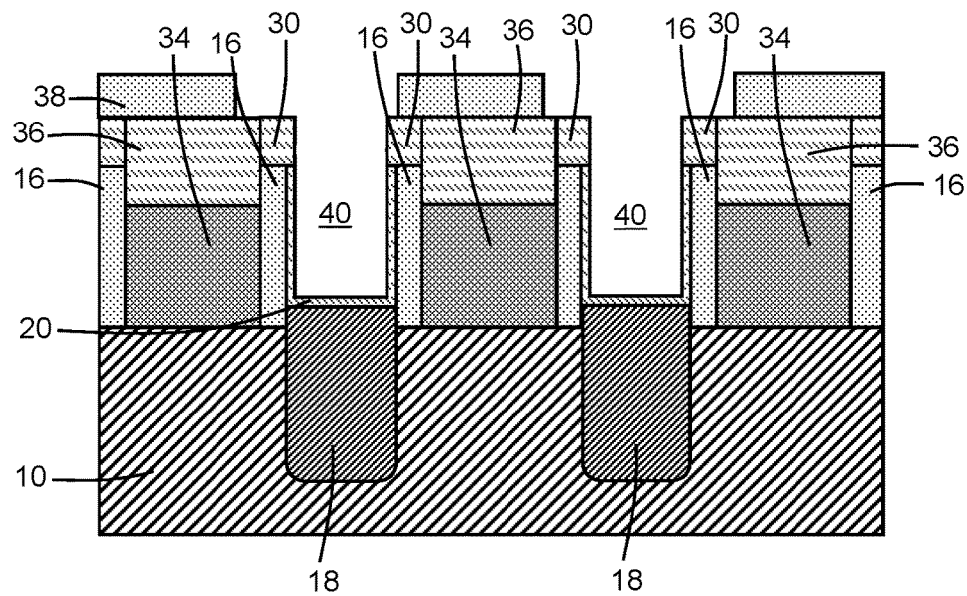

With reference to FIG. 7 in which like reference numerals refer to like features in FIG. 6 and at a subsequent fabrication stage, a sacrificial layer 38 is deposited over the caps 36 and patterned to provide openings through which the sections of the interlayer dielectric layer 22 are removed to open cavities 40 above the source/drain regions 18. The interlayer dielectric layer 22 may be removed by an etching process with an etch chemistry that is selective to the materials of the caps 36, the dielectric spacers 30, and the CESL 20. The caps 36, dielectric spacers 30, and CESL 20 cover and protect the dielectric spacers 16 during the performance of the etching process. The result is a reduced loss of the combined height of the dielectric spacers 16, 30 at the top corners as the spacers 30 are more resistant to etching than the dielectric spacers 16, which are conventionally exposed and eroded during this etching process.

Figure 8:
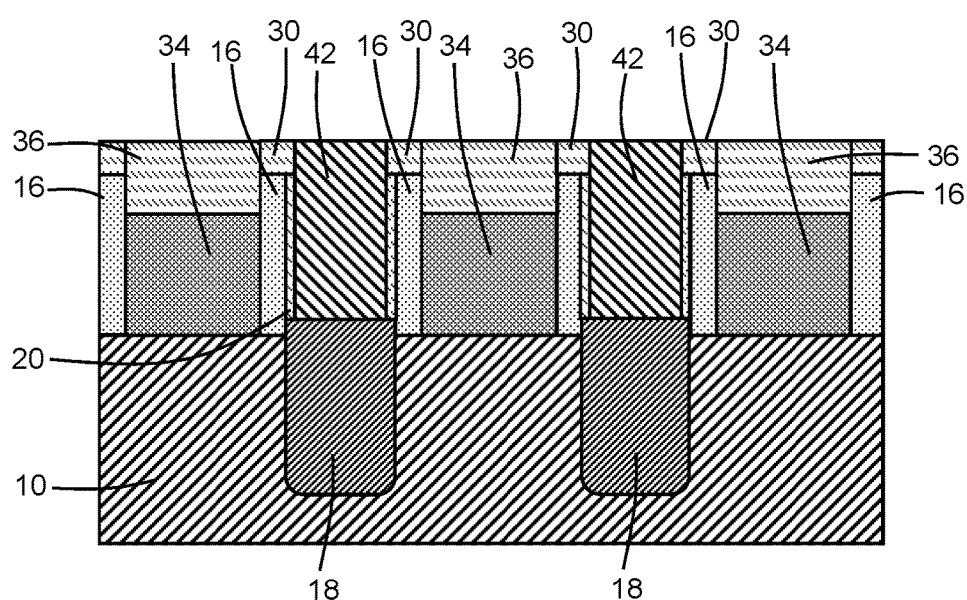

With reference to FIG. 8 in which like reference numerals refer to like features in FIG. 7 and at a subsequent fabrication stage, the CESL 20 is removed from the source/drain regions 18, and trench silicide (TS) contacts 42 are formed in the cavities 40 and extend vertically to the source/drain regions 18. The TS contacts 42 may include a metal silicide, such as tungsten silicide ($WSi_2$), titanium silicide ($TiSi_2$), nickel silicide (NiSi), or cobalt silicide ($CoSi_2$), formed by salicidation adjacent to the source/drain regions 18, as well as an overlying conductor, such as tungsten (W) or cobalt (Co), filling the remainder of each cavity 40 above the source/drain regions 18. The device structure may be planarized by chemical mechanical polishing (CMP) to the level of the dielectric spacers 30.

Figure 9:
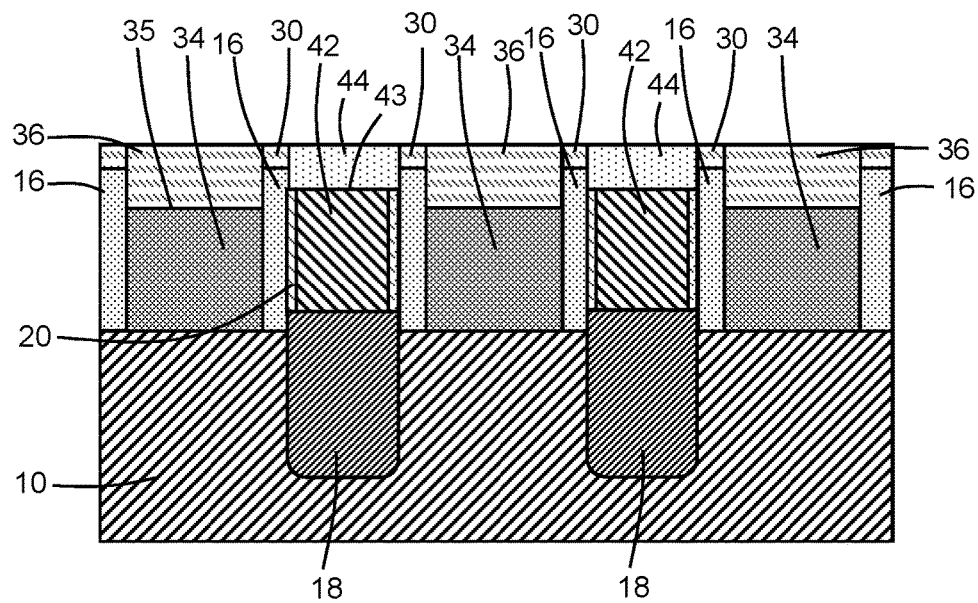

With reference to FIG. 9 in which like reference numerals refer to like features in FIG. 8 and at a subsequent fabrication stage, the TS contacts 42 may be recessed with a reactive etching process such that a top surface of each TS contact 42 is arranged below a top surface of the dielectric spacers 16. The top surface 43 of each TS contact 42 may be arranged above a top surface 35 of the functional gate structures 34. Sections of the CESL 20 arranged above the top surface of the recessed TS contacts 42 are then removed to expose sections of the dielectric spacers 16. The exposed sections of the CESL 20 are removed by an etching process with an etch chemistry that is selective to the materials of the dielectric spacers 30 and the dielectric spacers 16, as well as the TS contacts 42. The caps 36 and the dielectric spacers 30 may be thinned by the etching process.

A cap 44 is formed in the space above the recessed TS contacts 42. The cap 44 may be composed of a dielectric material, such as silicon dioxide ($SiO_2$) deposited by chemical vapor deposition (CVD) and planarized by chemical mechanical polishing (CMP).

Figure 10:
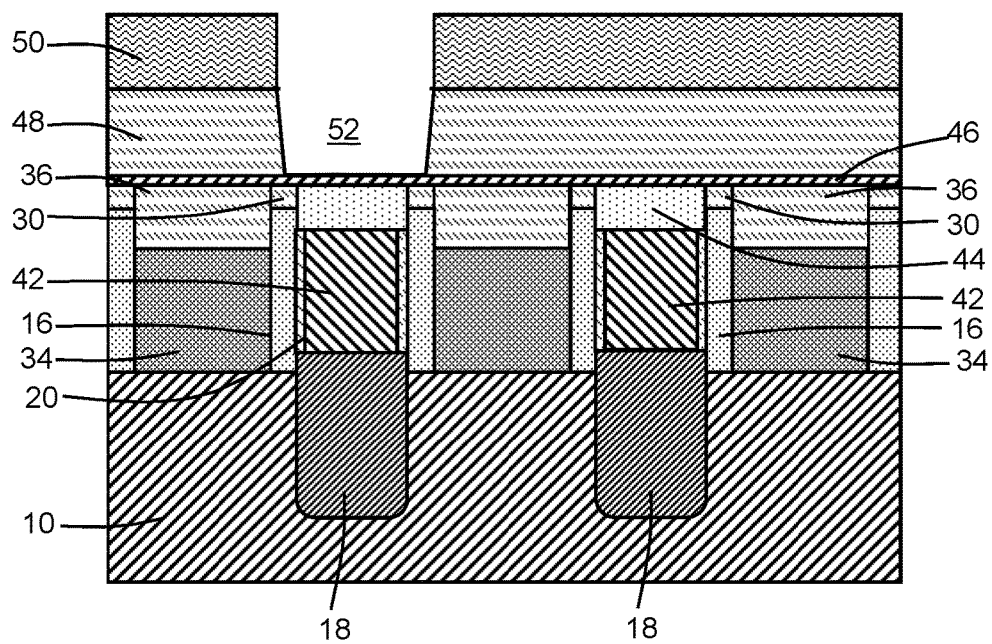

With reference to FIG. 10 in which like reference numerals refer to like features in FIG. 9 and at a subsequent fabrication stage, an etch stop liner 46 and an interlayer dielectric layer 48 are formed in a layer stack over the structure. The etch stop liner 46 may be composed of SiCO deposited by atomic layer deposition, and the interlayer dielectric layer 48 may be composed of a dielectric material, such as silicon dioxide ($SiO_2$) deposited by chemical vapor deposition (CVD). An etch mask 50 is formed on the interlayer dielectric layer 48. The etch mask 50 includes an opening that is aligned with one of the TS contacts 42. The etch mask 50 may be composed of a spin-on hardmask, such as an organic planarization layer (OPL), applied by spin coating and patterned.

An etching process is used to form an opening 52 in the interlayer dielectric layer 48 at the location of the opening in the etch mask 50. The etching process may rely on an etch chemistry that removes the dielectric material of the interlayer dielectric layer 48 selective to the material of the etch stop liner 46 such that the etching process stops on the etch stop liner 46.

Figure 11:
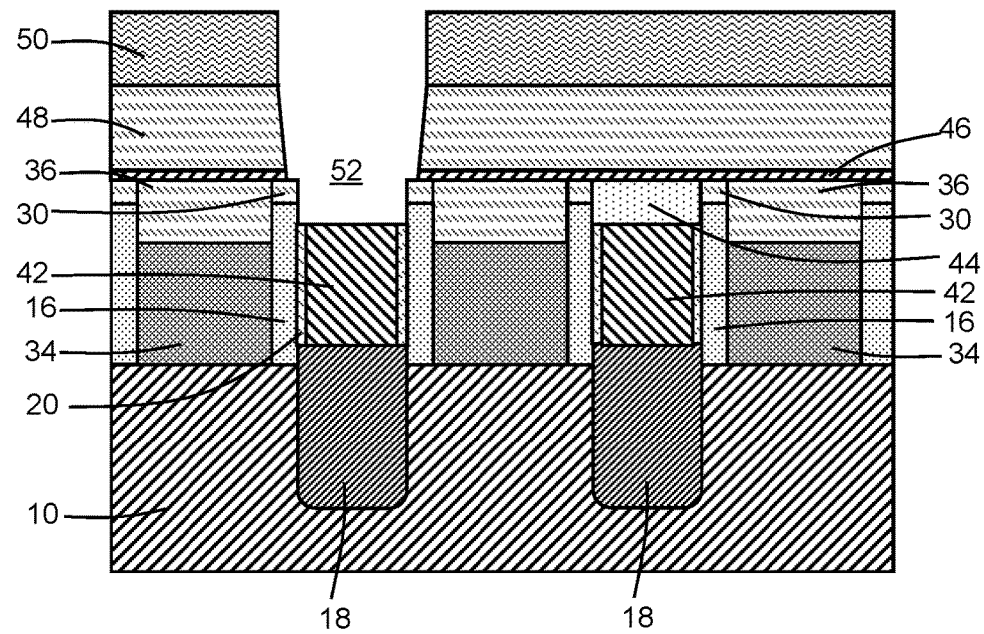

With reference to FIG. 11 in which like reference numerals refer to like features in FIG. 10 and at a subsequent fabrication stage, the opening 52 is extended through the etch stop liner 46 and then the cap 44 is removed from above the recessed TS contact 42. The cap 44 may be removed with an etching process, such as reactive ion etching (ME), that is selective to the material of the dielectric spacers 30. In the representative embodiment, the cap 44 is removed in its entirety. Due to the etch selectivity, the dielectric spacers 30 mask and protect the dielectric spacers 16 against erosion during the etching process.

Figure 12:
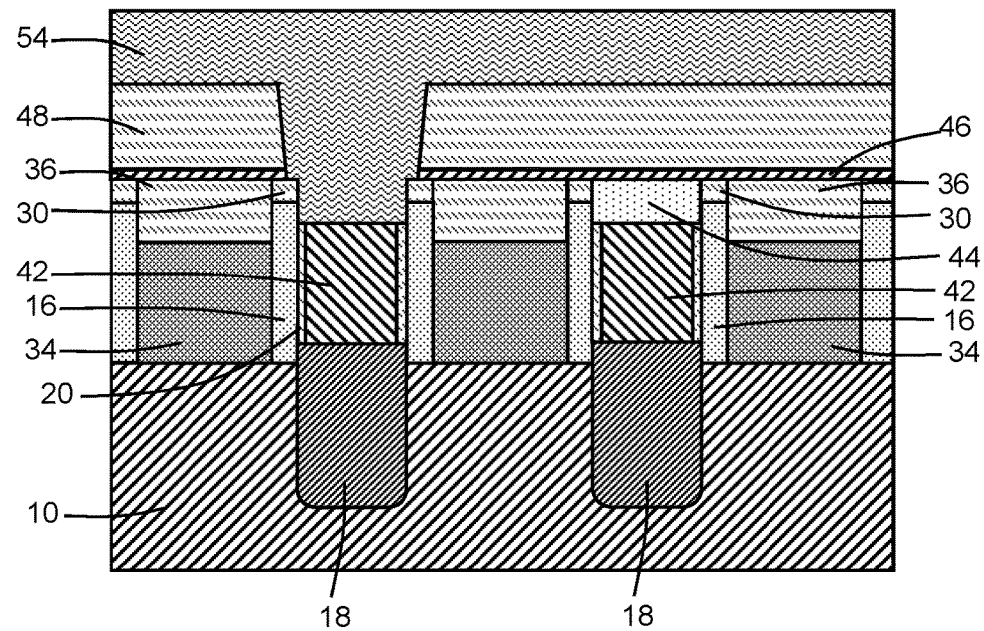
FIG. 12 is a cross-sectional view of the device structure at a fabrication stage subsequent to FIG. 11.
Figure 12A:
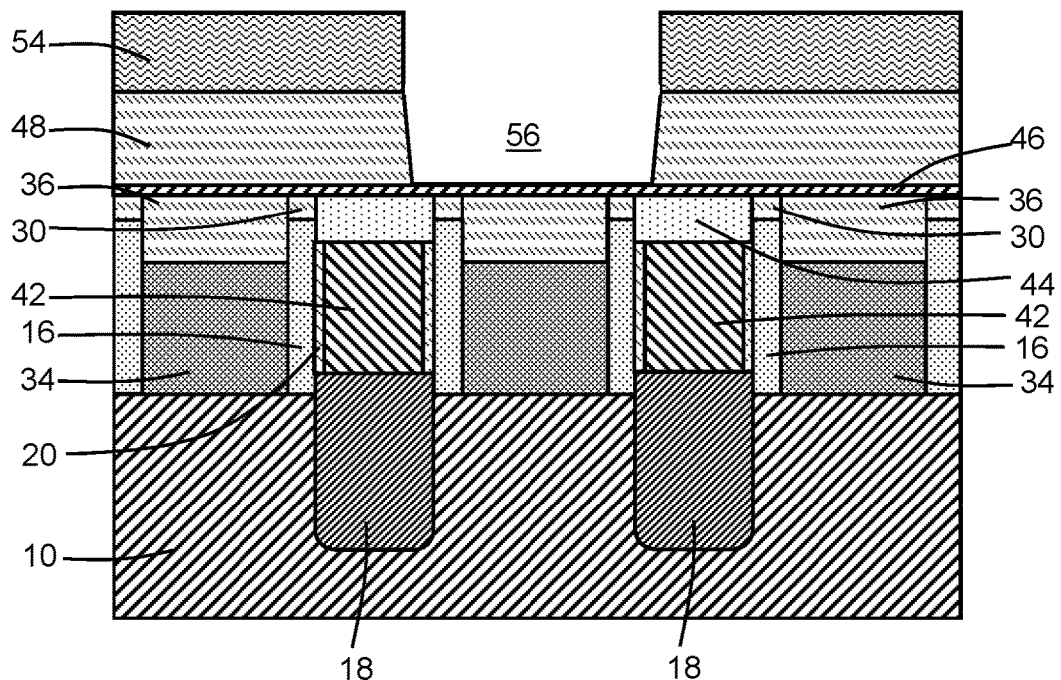
FIG. 12A is a cross-sectional view similar to FIG. 12 of the device structure.
Figure 12B:
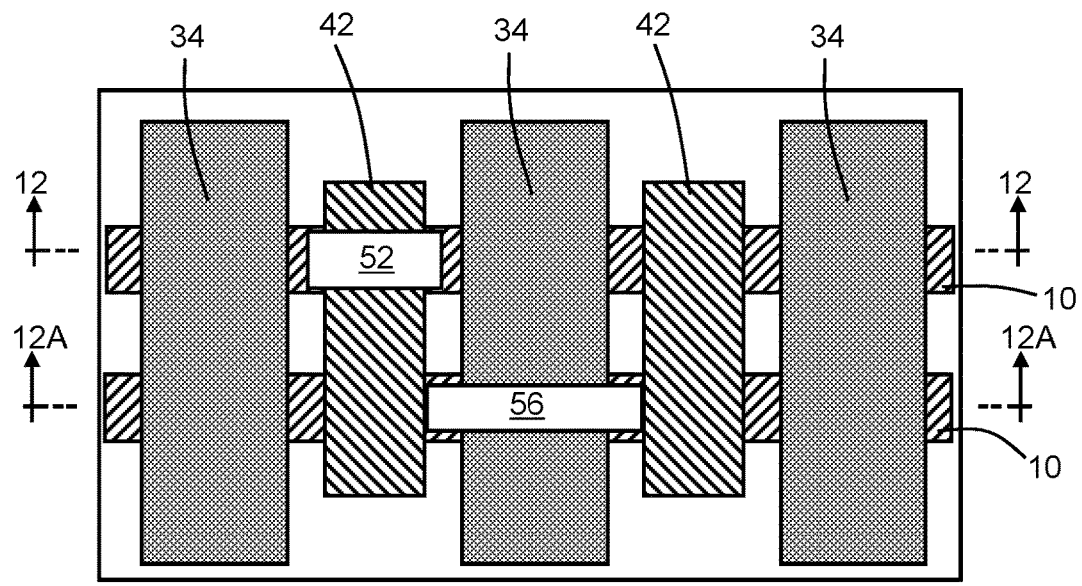

With reference to FIGS. 12, 12A, 12B in which like reference numerals refer to like features in FIG. 11 and at a subsequent fabrication stage, the etch mask 50 is stripped, and another etch mask 54 is formed on the interlayer dielectric layer 48. The etch mask 54 includes an opening that is aligned with one of the functional gate structures 34. The etch mask 54 may be composed of a spin-on hardmask, such as an organic planarization layer (OPL), applied by spin coating and patterned. An etching process is used to form an opening 56 in the interlayer dielectric layer 48 at the location of the opening in the etch mask 54 and may rely on a reactive ion etching process that removes the dielectric material of the interlayer dielectric layer 48 selective to the material of the etch stop liner 46.

Figure 13:
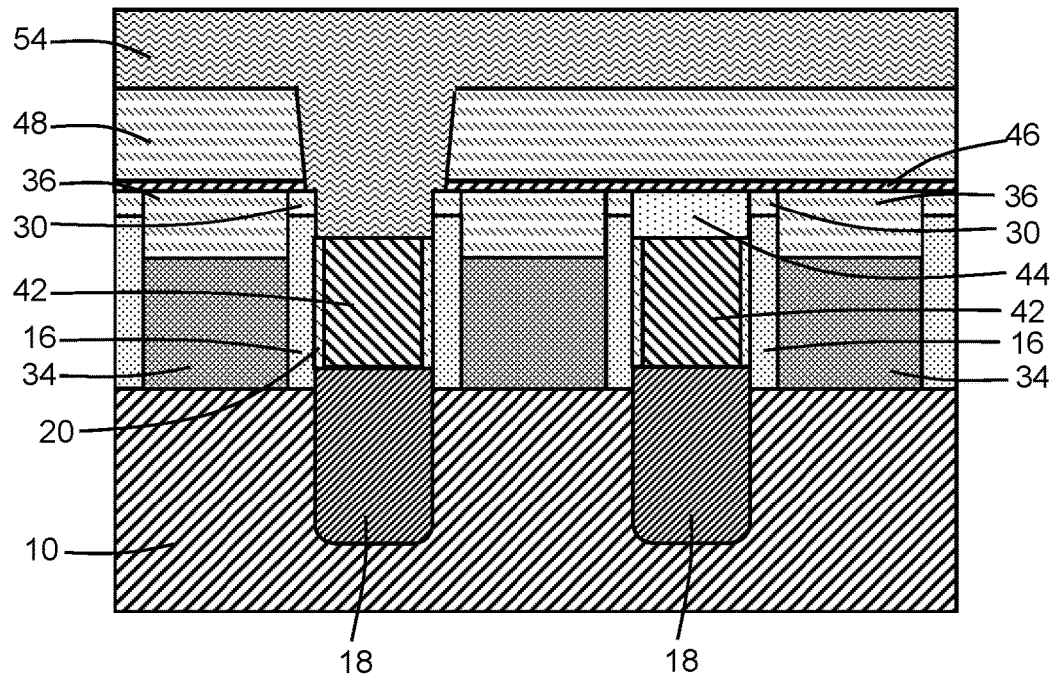
FIG. 13 is a cross-sectional view of the device structure at a fabrication stage subsequent to FIG. 12.
Figure 13A:
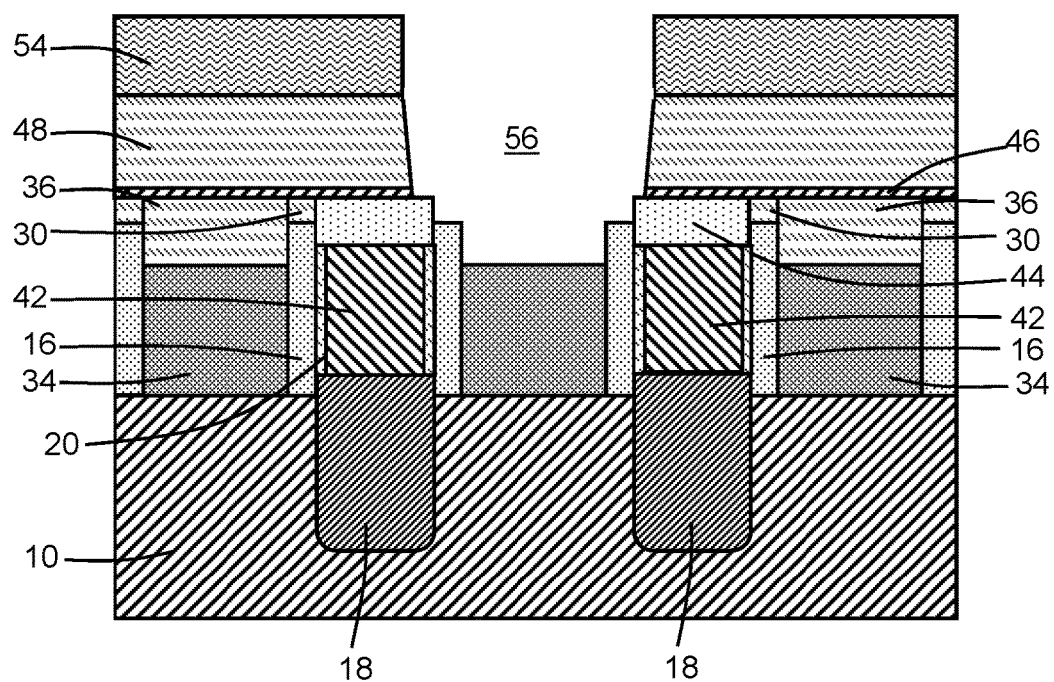
FIG. 13A is a cross-sectional view of the device structure at a fabrication stage subsequent to FIG. 12A.

With reference to FIGS. 13, 13A in which like reference numerals refer to like features in FIGS. 12, 12A and at a subsequent fabrication stage, the opening 56 is extended through the etch stop liner 46 and then the caps 36 and the remnant of the dielectric spacers 30 are removed from the space above functional gate structure 34 in order to reveal the gate electrode of the functional gate structure 34. The caps 36 and the remnant of the dielectric spacers 30 may be removed with an etching process, such as reactive ion etching (RIE), that removes the material of the capping layer selective to the materials of the caps 44 and the dielectric spacers 16. The opening 56 is aligned to expose the functional gate structure 34 over an active gate area that overlaps with the top surface 11 of the fin 10.

Figure 14:
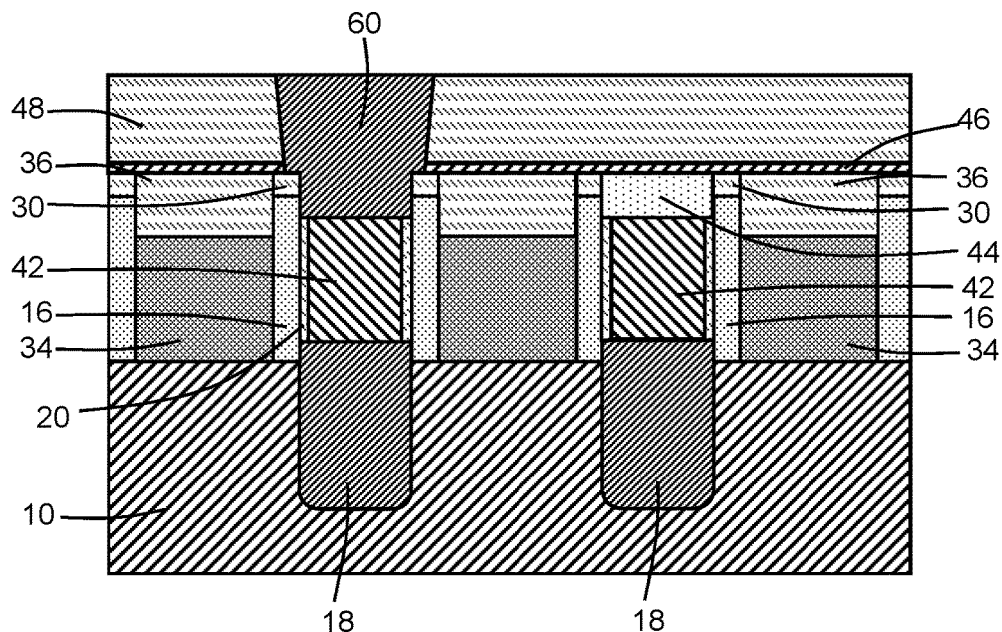
FIG. 14 is a cross-sectional view of the device structure at a fabrication stage subsequent to FIG. 13.
Figure 14A:
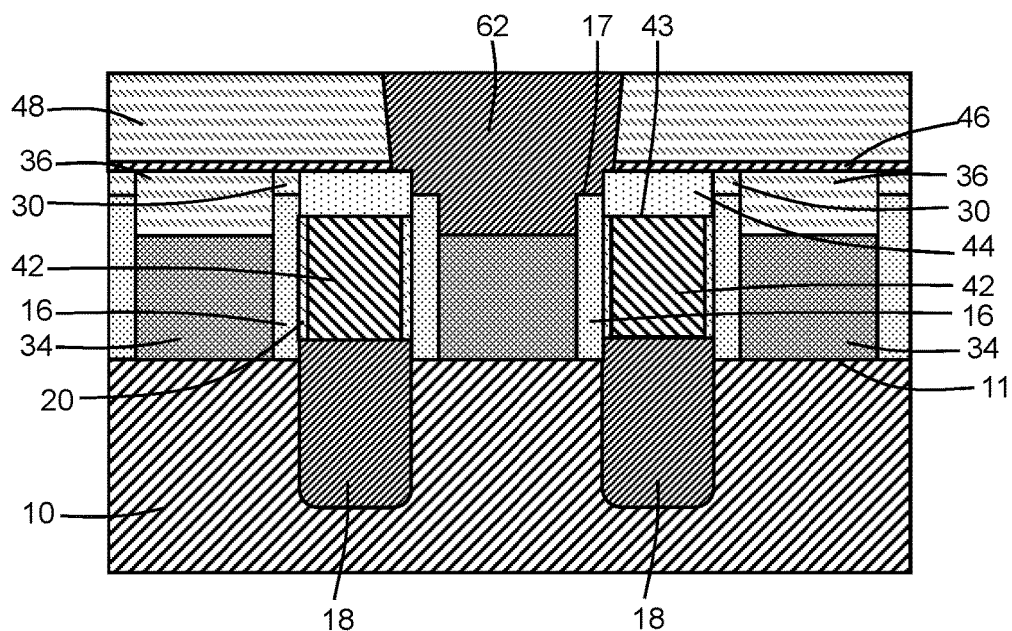
FIG. 14A is a cross-sectional view of the device structure at a fabrication stage subsequent to FIG. 13A.

With reference to FIGS. 14, 14A in which like reference numerals refer to like features in FIGS. 13, 13A and at a subsequent fabrication stage, the etch mask 54 is stripped, and contacts 60, 62 may be respectively formed in the openings 52, 56 as conductive features of a local interconnect structure. The contacts 60, 62 may be composed of a conductive material, such as tungsten (W) or cobalt (Co), deposited by chemical vapor deposition (CVD), physical vapor deposition (PVD), electrochemical plating (ECP), etc., and planarized by chemical mechanical polishing (CMP) to be coplanar with the top surface of the interlayer dielectric layer 48.

The contact 60 is connected with the TS contact 42 revealed at the base of opening 52. The contact 62 is connected with the gate electrode of the functional gate structure 34 revealed at the base of opening 56. The caps 44 are arranged between the contact 62 and the nearby TS contacts 42, and prevent shorting of the contact 62 with these nearby TS contacts 42. In addition, the dielectric spacers 16, which are taller than and extend above the top surface of the TS contacts 42, provide additional electrical isolation between the contact 62 and the nearby TS contacts 42. The dielectric spacers 16 have a top surface 17, and the top surface 43 of each of the TS contacts 42 is arranged vertically between the top surface 17 of the dielectric spacers 16 and the top surface 11 of the fin 10.

The contact 62, which is located in opening 56 (FIG. 12B), contacts the functional gate structure 34 over an area that overlaps with the top surface 11 of the fin 10. The contact 62 is therefore arranged over the active gate area in which, during operation, a channel in the fin 10 is gated by voltage applied to the gate electrode of the functional gate structure 34. This arrangement contrasts with conventional device constructions in which the contact to the gate electrode is arranged over the shallow trench isolation surrounding the active gate area.

Figure 15:
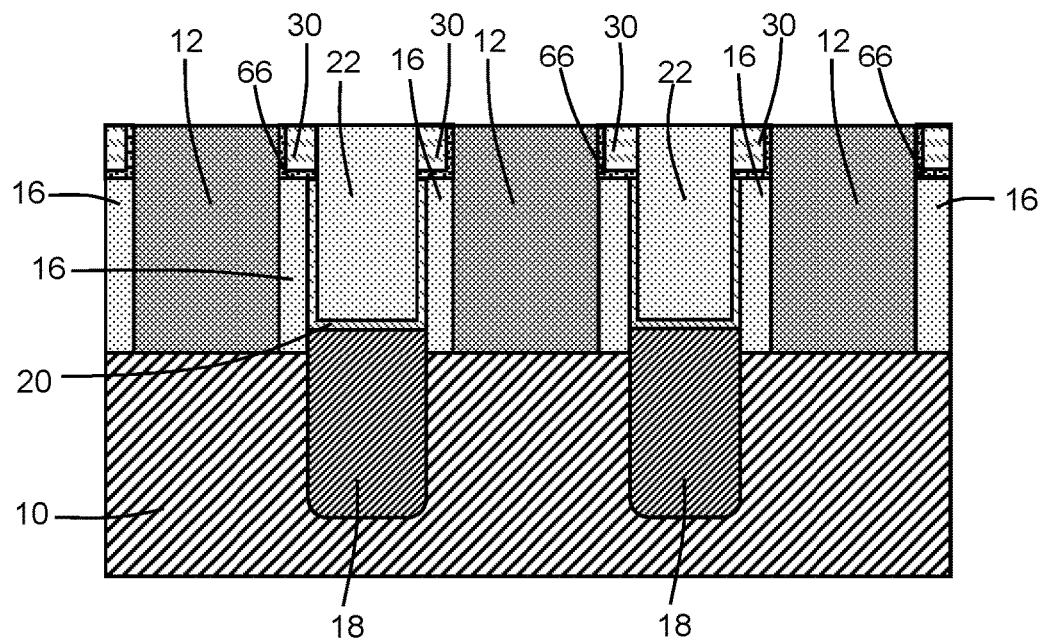
FIGS. 15-19 are cross-sectional views of a device structure at successive fabrication stages of a processing method in accordance with alternative embodiments of the invention.

With reference to FIG. 15 in which like reference numerals refer to like features in FIG. 4 and at a subsequent fabrication stage in accordance with alternative embodiments of the invention, dielectric spacers 66 may be formed as L-shaped structures inside the cavities 28 before the dielectric spacers 30 are formed. The dielectric spacers 66 may be composed of a dielectric material, such as aluminum nitride (AlN) or hafnium oxide ($HfO_2$), and may be formed by depositing a conformal layer that is partially masked by the dielectric spacers 30 and etched using an etching process, such as reactive ion etching (ME), with an etch chemistry that removes the material of the dielectric spacers 66 selective to the material of the dielectric spacers 30. Each dielectric spacer 66 includes a vertical section arranged adjacent to the sidewall of one of the sacrificial gate structures 12 and a horizontal section arranged on a top surface of one of the dielectric spacers 16. The vertical section 66a of each dielectric spacer 66 is arranged at an edge of the associated horizontal section 66b. The dielectric spacers 30 and the dielectric spacers 66 collectively form bilayer spacers that cover the top surface of the dielectric spacers 16. The process flow continues with the formation of the plugs 32 that restore the height of the interlayer dielectric layer 22.

Figure 16:
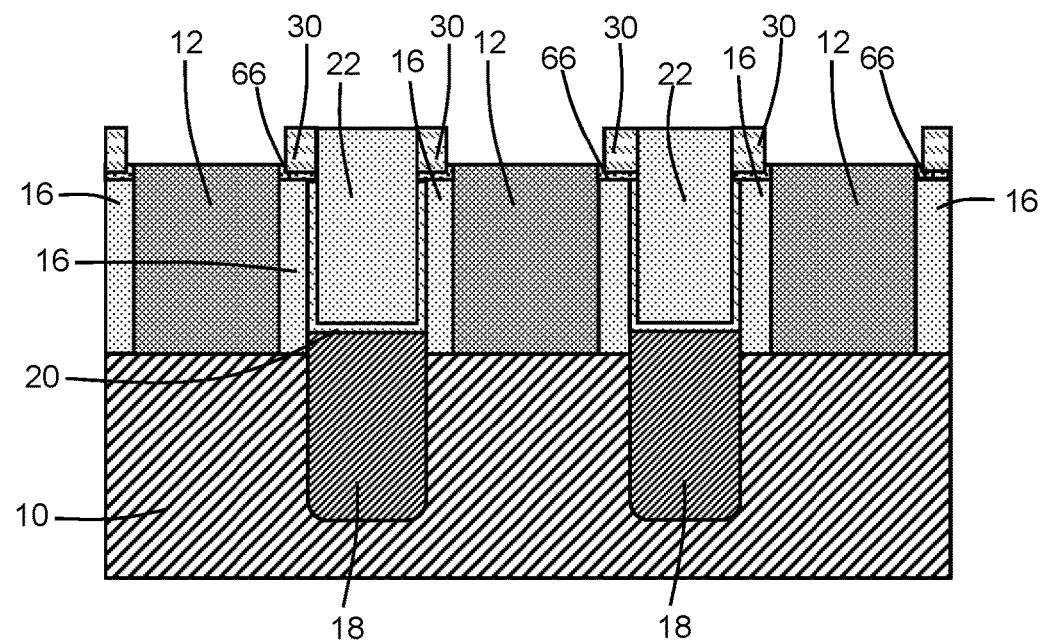

With reference to FIG. 16 in which like reference numerals refer to like features in FIG. 15 and at a subsequent fabrication stage, the sacrificial gate structures 12 are recessed using an etching process, such as reactive ion etching (RIE), that is selective to the material of the dielectric spacer 66. The top surface of the recessed sacrificial gate structures 12 is arranged above the top surface of the dielectric spacers 16. Portions of the vertical sections 66a (FIG. 15) of the dielectric spacers 66 are located above the top surface of the recessed sacrificial gate structures 12 and exposed. These exposed portions of the vertical sections 66a of the dielectric spacers 66 are removed using an etching process, such as reactive ion etching (RIE), that is selective to the material of the dielectric spacers 66. The recessed top surface of the sacrificial gate structures 12 is arranged above the top surface of the dielectric spacers 16.

Figure 17:
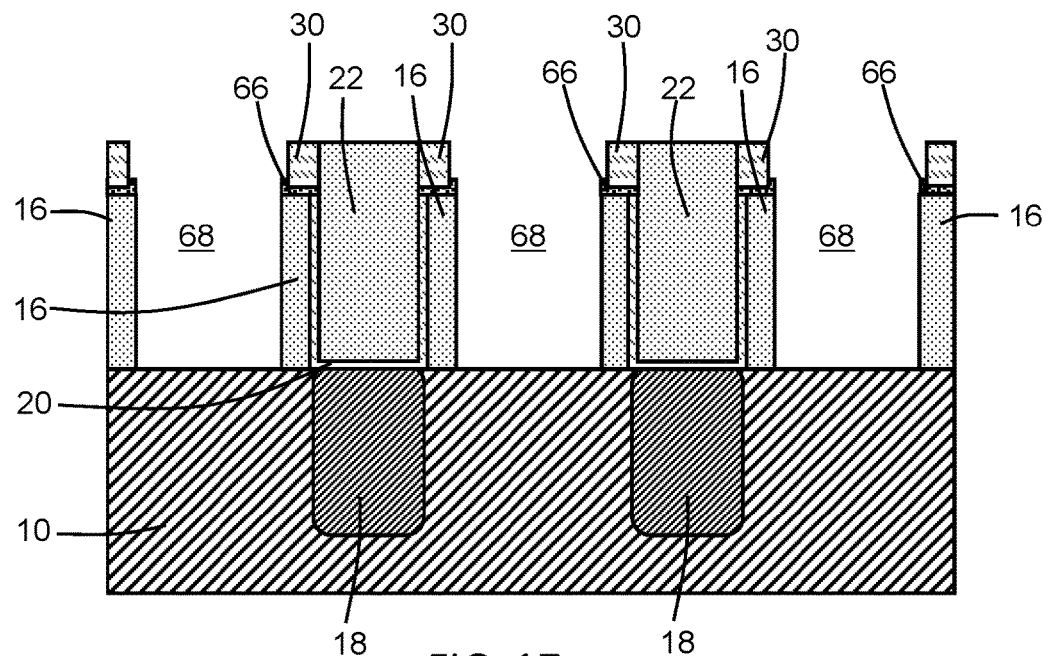

With reference to FIG. 17 in which like reference numerals refer to like features in FIG. 16 and at a subsequent fabrication stage, the recessed sacrificial gate structures 12 are removed using an etching process, such as a wet chemical etch, that is selective to the materials of the dielectric spacers 66, the dielectric spacers 30, and the dielectric spacers 16. The dielectric spacers 66 cover and protect the dielectric spacers 16 during the removal of the recessed sacrificial gate structures 12. Due to the presence of the dielectric spacers 66, dual-width cavities 68 are formed that are wider at a vertical location between the dielectric spacers 30 and narrower at a vertical location between the dielectric spacers 16. The dual-width cavities 68 may provide an improved profile that aids in the formation of the functional gate structures 34 in the cavities 68.

Figure 18:
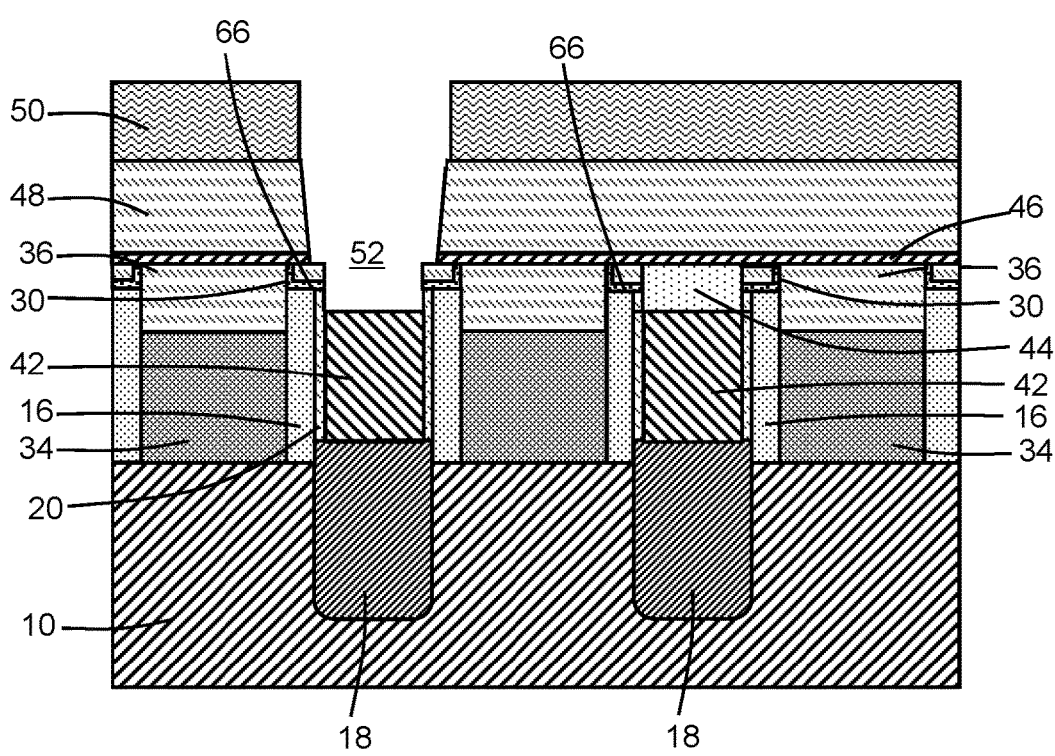

With reference to FIG. 18 in which like reference numerals refer to like features in 17 and at a subsequent fabrication stage, the functional gate structures 34 and caps 36 are formed as described in connection with FIG. 6 and the process flow continues as described in connection with FIGS. 7-10. When the opening 52 is extended through the etch stop liner 46 and the cap 44 is removed from above the recessed TS contact 42, the dielectric spacers 66 provide additional erosion protection to the top corners of the dielectric spacers 16.

Figure 19:
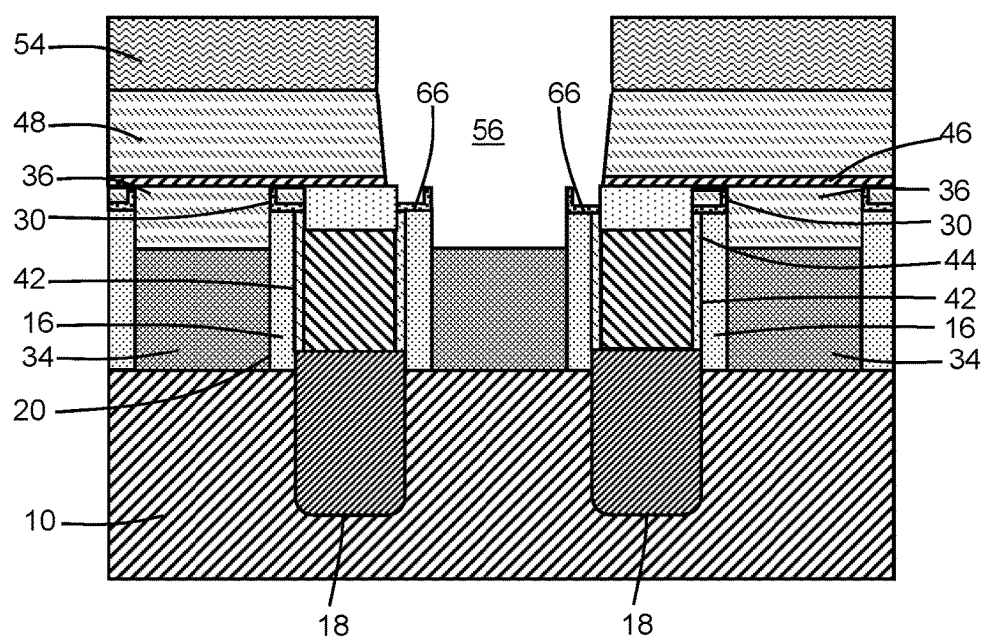

With reference to FIG. 19 in which like reference numerals refer to like features in FIG. 18 and at a subsequent fabrication stage, the process flow continues as described hereinabove in connection with FIG. 12A to form etch mask 54 on the interlayer dielectric layer 48. The opening 56 is formed in the interlayer dielectric layer 48 at the location of the opening in the etch mask 54. The opening 56 is extended through the etch stop liner 46 and then the caps 36 and the remnant of the dielectric spacers 30 are removed from the space above functional gate structure 34 in order to reveal the gate electrode of the functional gate structure 34. The etching process removing the caps 36 and the remnant of the dielectric spacers 30 may use an etching process with an etch chemistry that is selective to the dielectric material of the dielectric spacers 66, which protect the dielectric material at the top corners of the dielectric spacers 16 against erosion by the etching process. The process flow continues as described in the context of FIGS. 14, 14A to form the contacts 60, 62.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first dielectric spacer adjacent to a sidewall of a gate placeholder structure;
   forming a contact placeholder structure adjacent to the first dielectric spacer such that the first dielectric spacer is arranged laterally between the gate placeholder structure and the contact placeholder structure;
   recessing the contact placeholder structure and the first dielectric spacer to open a first space over the contact placeholder structure and the first dielectric spacer; and
   forming a second dielectric spacer in a portion of the first space adjacent to the sidewall of the gate placeholder structure and over the first dielectric spacer.

2. The method of claim 1 further comprising:
   replacing the gate placeholder structure with a gate structure; and
   recessing a top surface of the gate structure to open a second space over the gate structure.

3. The method of claim 1 wherein the gate placeholder structure includes a sacrificial gate structure and a cap on the sacrificial gate structure, and further comprising:
   after forming the first dielectric spacer, removing the cap from the sacrificial gate structure to open a second space above the sacrificial gate structure; and
   after removing the cap, depositing a layer composed of a sacrificial material in the second space to increase a height of the sacrificial gate structure.

4. The method of claim 1 further comprising:
   after forming the second dielectric spacer, removing the contact placeholder structure to open a second space over a source/drain region; and
   forming a first contact that extends vertically in the second space to the source/drain region.

5. The method of claim 1 further comprising:
   before forming the second dielectric spacer, depositing a conformal layer on the sidewall of the gate placeholder structure and a top surface of the first dielectric spacer.

6. The method of claim 2 further comprising:
   forming a dielectric cap in the second space over the top surface of the gate structure.

7. The method of claim 2 wherein the first dielectric spacer includes a top surface, the second dielectric spacer is formed on the top surface of the first dielectric spacer, and the top surface of the gate structure is recessed below the top surface of the first dielectric spacer.

8. The method of claim 2 wherein the top surface of the gate structure is recessed selective to the first dielectric spacer and the second dielectric spacer.

9. The method of claim 3 wherein the sacrificial gate structure and the sacrificial material are composed of amorphous silicon.

10. The method of claim 4 further comprising:
    recessing a top surface of the first contact; and
    forming a first dielectric cap on the recessed top surface of the first contact.

11. The method of claim 10 wherein the top surface of the first contact is recessed below a top surface of the first dielectric spacer.

12. The method of claim 10 wherein the second dielectric spacer is composed of a first dielectric material, and the first dielectric cap is composed of a second dielectric material that is removable selective to the first dielectric material.

13. The method of claim 10 further comprising:
    before removing the contact placeholder structure, replacing the gate placeholder structure with a gate structure;
    recessing a top surface of the gate structure; and
    forming a second dielectric cap over the recessed top surface of the gate structure.

14. The method of claim 13 further comprising:
after forming the first dielectric cap, depositing an interlayer dielectric layer over the first dielectric cap, the second dielectric cap, and the second dielectric spacer;
etching a contact opening that extends through the interlayer dielectric layer to the first dielectric cap, the second dielectric cap, and the second dielectric spacer;
removing the first dielectric cap and the second dielectric spacer selective to the first dielectric cap to open a third space above the first contact; and
forming a second contact in the third space.

15. The method of claim 5 wherein the conformal layer is composed of hafnium oxide or aluminum nitride, and the second dielectric spacer is composed of silicon nitride.

16. A structure comprising:
a semiconductor layer including a top surface and a source/drain region;
a gate structure extending across the top surface of the semiconductor layer;
a first contact extending vertically to contact the source/drain region;
a second contact extending vertically to contact the gate structure;
a first dielectric spacer on the top surface of the semiconductor layer adjacent to the gate structure, the first dielectric spacer arranged laterally between the first contact and the gate structure; and
a second dielectric spacer over the top surface of the first dielectric spacer and arranged in part between the top surface of the first dielectric spacer and the second contact,
wherein the first dielectric spacer has a top surface, the first contact has a top surface, and the top surface of the first contact is closer to the top surface of the semiconductor layer than the top surface of the first dielectric spacer.

17. The structure of claim 16 wherein the semiconductor layer is a semiconductor fin, and the second contact is in contact with the gate structure over an area that overlaps with an active gate area above the top surface of the semiconductor fin.

18. The structure of claim 16 wherein the second dielectric spacer includes a first section on the top surface of the first dielectric spacer and a second section extending vertically from an edge of the first section.

19. A method comprising:
forming a gate placeholder structure that includes a sacrificial gate structure and a dielectric cap on the sacrificial gate structure;
forming a first dielectric spacer and a second dielectric spacer respectively adjacent to opposite sidewalls of the gate placeholder structure;
after forming the first dielectric spacer and the second dielectric spacer, removing the dielectric cap from the sacrificial gate structure to open a space vertically above the sacrificial gate structure and laterally between the first dielectric spacer and the second dielectric spacer; and
after removing the dielectric cap, depositing a layer composed of a sacrificial material in the space to increase a height of the sacrificial gate structure.

20. The method of claim 19 wherein the sacrificial gate structure and the sacrificial material are composed of amorphous silicon.

\* \* \* \* \*